(12) United States Patent
Stein et al.

(10) Patent No.: US 9,634,679 B1
(45) Date of Patent: Apr. 25, 2017

(54) DIGITAL DOWN CONVERTER WITH EQUALIZATION

(71) Applicant: Guzik Technical Enterprises, Mountain View, CA (US)

(72) Inventors: Anatoli B. Stein, Atherton, CA (US); Semen P. Volfbeyn, Palo Alto, CA (US); Alexander Taratorin, Palo Alto, CA (US); Igor Tarnikov, Palo Alto, CA (US); Valeriy Serebryanskiy, Sunnyvale, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 15/242,467

(22) Filed: Aug. 19, 2016

(51) Int. Cl.
  *H03M 1/12* (2006.01)
  *H03M 1/06* (2006.01)
  *H03M 1/00* (2006.01)

(52) U.S. Cl.
  CPC ....... *H03M 1/0626* (2013.01); *H03M 1/1245* (2013.01); *H03M 1/00* (2013.01); *H03M 1/0695* (2013.01); *H03M 1/12* (2013.01)

(58) Field of Classification Search
  CPC ......... H03M 1/12; H03M 1/00; H03M 1/0695
  USPC ................ 341/155, 156, 120, 161, 162, 163
  See application file for complete search history.

(56) References Cited

U.S. PATENT DOCUMENTS

| 7,408,495 | B2 | 8/2008 | Stein et al. |
| 8,831,085 | B2 * | 9/2014 | Hezar ................... H04L 1/0071 375/238 |
| 9,148,162 | B2 | 9/2015 | Stein et al. |
| 2016/0241253 | A1 | 8/2016 | Taratorin et al. |

OTHER PUBLICATIONS

Co-pending U.S. Appl. No. 15/229,578, filed Aug. 5, 2016, in the name of Guzik Technical Enterprises.

* cited by examiner

*Primary Examiner* — Joseph Lauture
(74) *Attorney, Agent, or Firm* — Burns & Levinson LLP; Joseph M. Maraia (57) ABSTRACT

A digital down converter with equalization includes a composite ADC that performs demodulation of a received analog signal, converting the signal into in phase baseband signal and quadrature baseband signal. Equalization is performed to correct for misalignment of the frequency responses of the sub-ADCs in the composite ADC. In a form, ADC output signals are applied to a mixer array to frequency down-shift the digital form of the input signal, followed by digital filtering to effect convolutions of portions of the digital form of the input signal with a set of convolution coefficients determined so that the net processing is mathematically equivalent to down conversion with equalization. In another form, the ADC output signals are directly applied to a digital filter to effect both frequency down-shifting and convolutions, with filter coefficients determined so that the net processing is mathematically equivalent to down conversion with equalization.

10 Claims, 9 Drawing Sheets

DIGITAL DOWN CONVERTER WITH EQUALIZATION

FIELD OF THE INVENTION

The invention relates to high speed analog-to-digital converters (ADC) and, more particularly, to digital equalization in frequency down converters intended for wireless receivers.

BACKGROUND OF THE INVENTION

Down converters in wireless receivers perform a transformation of a radio frequency (RF) signal into a baseband signal centered at the zero frequency. In high performance equipment, digital down converters are used, making it necessary to convert an analog RF signal into a digital signal. Typically, a high speed ADC is used because of the high frequency of the RF signal.

High speed analog to digital converters are built as composite ADCs that consist of a number of interleaved sub-ADCs with a common input and sequential timing. In general, the amplitude and phase frequency responses of the different sub-ADCs are not identical, resulting in specific signal distortions, for example, the appearance of spurious frequency components. To prevent these distortions, equalization of the responses of the sub-ADCs is used (see, for example, U.S. Pat. No. 7,408,495).

Figure 1:
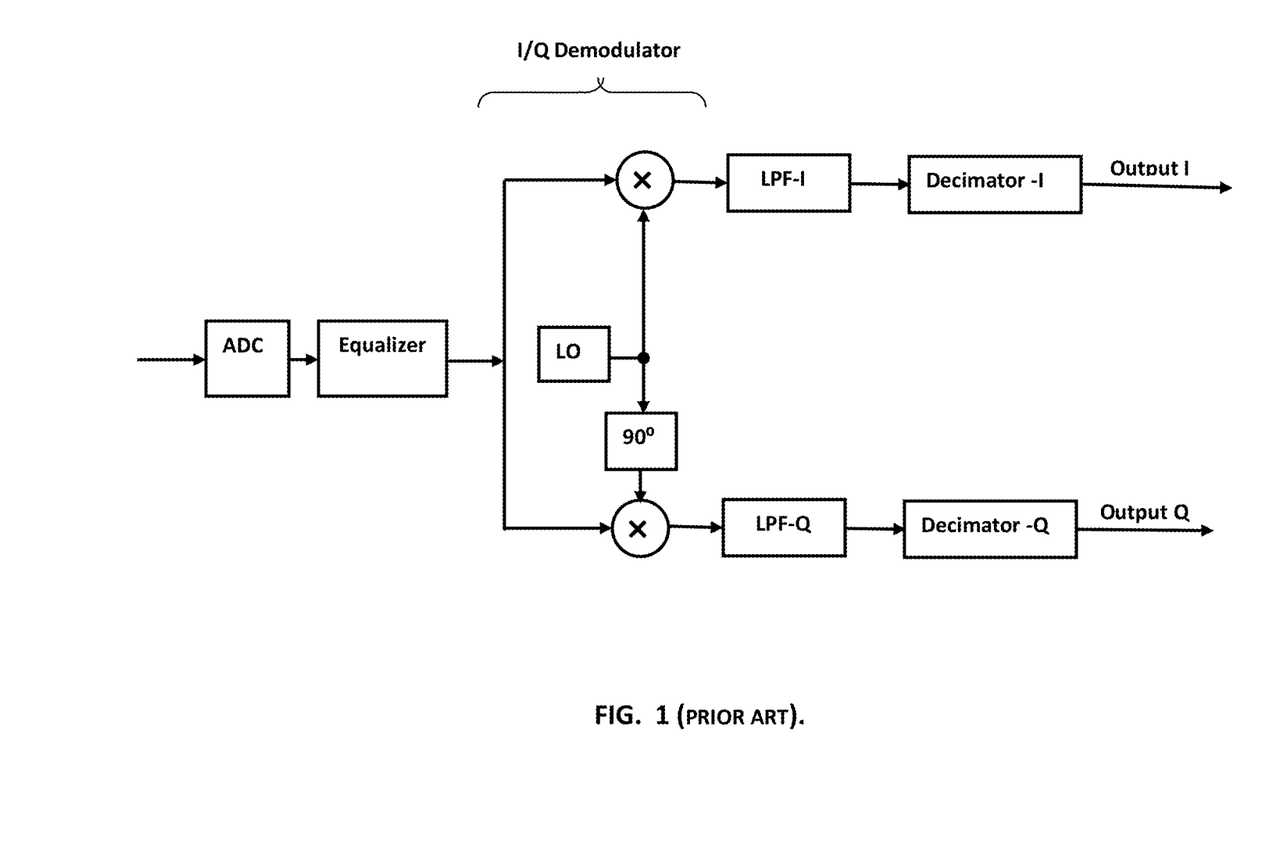
FIG. 1 shows a conventional block diagram of a digital down converter with equalization

A block diagram of a conventional digital down converter with an equalizer is shown in FIG. 1. In the digital down converter of FIG. 1, an RF signal, applied to the input of a composite ADC, is transformed into a digital signal. The misalignment of the frequency responses of the sub-ADCs of the ADC, is corrected by an equalizer. The corrected signal is applied to an I/Q demodulator constructed using two mixers with the same local oscillator frequency and with a phase difference of 90°. The resultant demodulated signals are applied to low pass filters (LPF-I and LPF-Q) with following decimators (Decimator-I and Decimator-Q, producing two outputs: In-Phase (I) and Quadrature (Q), labeled Output I and Output Q, respectively, in FIG. 1.

The ADC equalizer and low pass filters in the block diagram of FIG. 1 are built usually as conventional FIR filters. The most resource-consuming components of the FIR filters are multipliers. Because of the difference between the RF signal frequency (usually several GHz) and the frequency of operation of present-day computing devices (up to 200-250 MHz for an FPGA, for example), each multiplication in the FIR is carried out by a group of multipliers connected in parallel. The required number of multipliers becomes the main reason that makes it necessary to use in the equalizer design, large amounts of computing resources or, in some cases, makes a real time equalizer design impossible.

It is possible to reduce to some extent, the required number of multipliers in the conventional down converter of the type shown in FIG. 1, by embedding the decimation function within the low pass filters between the principal shift register of the FIR and the multipliers (see, for example, J. G. Proakis and D. G. Manolakis, "Digital Signal Processing: Principles, Algorithms, and Applications", 3$^{rd}$ Edition, Prentice-Hall International Inc., pp. 793-797). In such a design, the multiplications in the low pass filters are performed at lower sampling rates, with a consequent possibility to reduce the required number of multipliers. However, the number of multipliers in the equalizer far exceeds the number of multipliers in the low pass filters. For this reason, a reduction of the number of multipliers only in the filters, does not lead to a substantial decrease of the total number of multipliers in the down converter.

A down converter with a reduced number of multipliers was suggested in U.S. Pat. No. 9,148,162. In a down converter according to the '162 patent, equalization is combined with down conversion and performed in I and Q branches separately. Furthermore, three cascade-connected units in each branch (equalizer, mixer and low pass filter) are replaced by a single equivalent finite impulse response filter (FIR). A decimator is placed inside that FIR before the multipliers. As a result, the frequency of each multiplication in the down converter is lowered and the number of required multipliers is reduced significantly.

Figure 2:
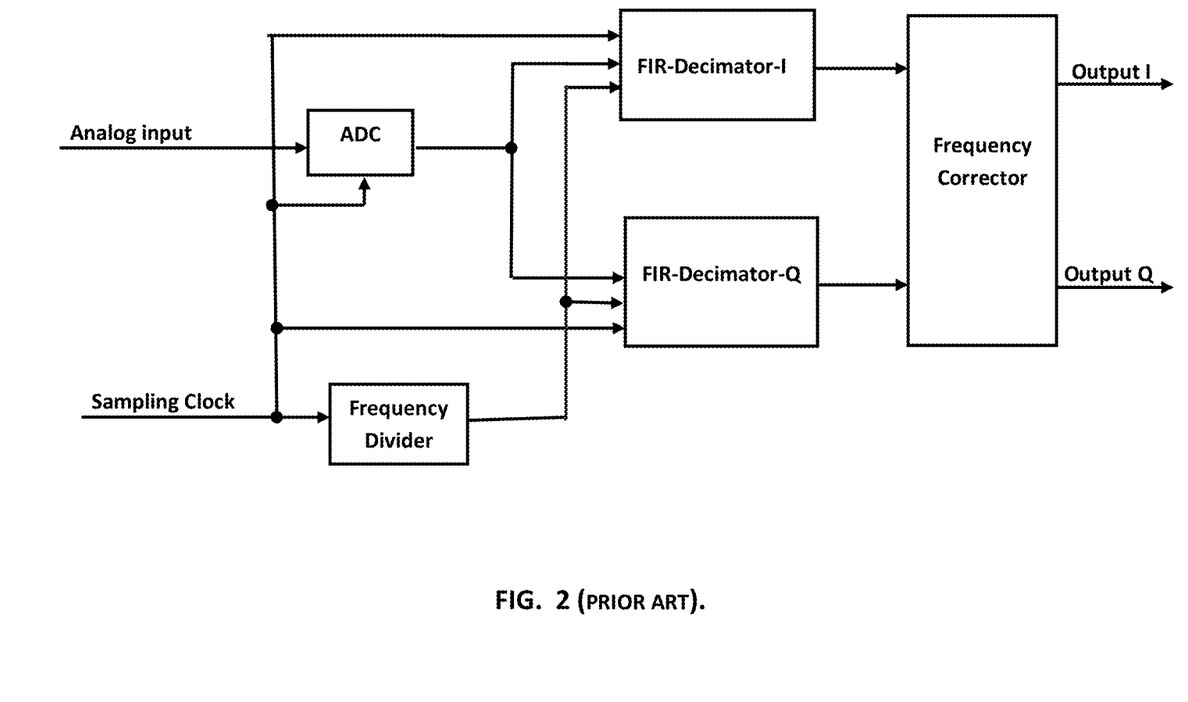
FIG. 2 shows an improved block diagram of a digital down converter with equalization (prior art).

A block diagram of a digital down converter with equalization in accordance with U.S. Pat. No. 9,148,162 is shown in FIG. 2. The block diagram has an analog input, a sampling clock input and two outputs: output I and output Q. The digital down converter of the '162 patent comprises an analog to digital converter (ADC), a frequency divider, two FIRs with time variant coefficients and built-in decimators: FIR-decimator-I and FIR-decimator-Q, and a frequency corrector. The analog to digital converter transforms the input analog signal into a digital signal. The frequency divider receives the sampling clock and produces a low frequency clock (LF_Clock) with a frequency that equals the frequency of the sampling clock divided by a decimation factor. Successful operation of the digital down converter is achieved by loading into the FIR-decimator-I and FIR-decimator-Q properly calculated coefficients.

The reduction of the number of required multipliers in the block diagram of FIG. 2 makes it possible to build digital down converters that operate in a real time mode even in high frequency receivers. However, the described digital down converter has drawbacks that make difficult to achieve successful use.

In particular, the down converter according to FIG. 2 is able to correct only frequency responses that are symmetrical relative a local oscillator (LO) frequency $F_{LO}$: the loss and change in phase should be the same at frequencies $F_{LO}$-f and $F_{LO}$+f. However, sub-ADCs in a composite ADC may be asymmetric with regard to an LO frequency of the down converter. As a consequence, ADCs cannot be equalized by the configuration set forth in the block diagram of FIG. 2.

The FIR-decimators incorporated in the block diagram of FIG. 2 necessarily include shift registers that operate with the sampling rate of the ADC. As a consequence, one cannot implement a down converter using conventional computing devices with speed of operation that is less than sampling rate of an ADC.

It is desirable to provide an improved digital down converter, which is able to equalize asymmetrical frequency responses, as well as symmetrical ones, and makes possible implementation by conventional computing devices.

SUMMARY

A digital down converter, for example, useful in radio receivers, is a device generally including a composite ADC, that performs demodulation of a received radio frequency signal, converting the signal into a pair of baseband signals: an in phase baseband signal I, and a quadrature baseband signal Q. The main parameters of a frequency down converter are carrier frequency $F_c$, sampling rate B of the modulated I/Q baseband signals, sampling frequency $F_s$ of the ADC, the number P of sub-ADCs in the used composite ADC, the complex valued frequency responses H(p, F) of the different sub-ADCs (p being a number of a sub-ADC), and the operation frequency $F_o$ of the used computing resources.

In that structure, the digital down converter (the "DDC") carries out several operations:

i. The DDC converts an input RF analog signal into a digital ADC output signal for subsequent processing, using the composite ADC to sample the input RF signal and generate successions of digital sample signals. The ADC is characterized by a sampling frequency $F_s$ and the frequency responses of its sub-ADCs.

ii. The DDC performs a frequency translation of the digital ADC output signal from the RF domain, down to baseband. The frequency translation is fulfilled by multiplication of the samples of the digital ADC output signal by $\cos(2\pi F_c/Fs \cdot n)$ in the in a phase branch, and by $\sin(2\pi F_c/Fs \cdot n)$ in a quadrature branch (where n is a number of the sample in the digital signal). The multiplication is followed by low pass filtering to suppress high frequency components created during the frequency translation. To reduce interference between adjacent symbols of the filtered signal, a filter that meets Nyquist inter-symbol interference (ISI) criterion may be used, preferably a Square Root Raised Cosine (SRRC) filter. The acceptable level of out of band components determines the number $L_f$ coefficients in the digital filter realization.

iii. The DDC performs equalization to correct misalignment of the frequency responses of the sub-ADCs in the composite ADC, and to shape the frequency response of the down converter in compliance with specified requirements. The equalization accuracy depends on the number $L_{eq}$ of coefficients in the realization. The number L that equals the largest of $L_f$ and $L_{eq}$ is an important parameter of the down converter.

The down converter according to the block diagram of FIG. 1, the down converter according to the block diagram of FIG. 2 and the down converter according to the present invention, all carry out the operation just listed. However, the down converter according to the block diagram of FIG. 2 and the down converter according to the present invention both require for these operations, a number of multiplications that is less than the number of multiplications required in the down converter according to the block diagram of FIG. 1 by a decimation factor $DF=F_s/B$.

The prior art down converter according to the block diagram of FIG. 2 incorporates a unit (a shift register) that operates with the frequency $F_s$, hindering its implementation by a common computing apparatus. In addition, such a down converter is able to correct only frequency responses symmetrical in relation to a carrier frequency $F_c$. In contrast, all components of the down converter according to the present invention, operate at the frequency $F_o$, and the down converter corrects asymmetrical frequency responses as well as symmetrical ones.

According to the present invention, the determination of a next pair of the output I and Q samples is carried out by a calculation of a convolution of a corresponding piece of the input signal with a proper set of coefficients. Those coefficients are determined in such a way that the convolution calculation is equivalent to the execution of the operations just listed. The convolution calculation is performed by a set of processing units operating in parallel, thus providing for compliance with the inner structure of contemporary computing devices, such as FPGAs.

In the present invention, equalization is performed using a complex signal processing approach (see, for example, K. W. Martin, "Complex Signal Processing Is Not Complex", IEEE Trans. Circuits and Systems, vol. 51, pp. 132-139, September 2004). An asymmetrical (in the frequency domain) equalizer with a transfer function that does not have the conjugate symmetry of real filters, is built by using cross-coupling between real and imaginary signal paths. This implies that the equalizer performs a convolution of the processed signal with a set of complex coefficients.

It is known, that to ensure an accurate compensation of frequency distortions in a composite ADC, the equalizer coefficients should be calculated taking into account not only the frequency responses of the sub-ADCs which produce current samples, but also the frequency responses of the ADCs which produced adjacent samples as well. The herein illustrated embodiment of the present invention is configured to calculate coefficients using the frequency responses of all the sub-ADCs of the composite ADC. This system and method is novel and is more straightforward than previously known ones and is suitable for calculation of complex equalizer coefficients.

BRIEF DESCRIPTION OF THE DRAWINGS

PRIOR ART

DETAILED DESCRIPTION

Figure 3:
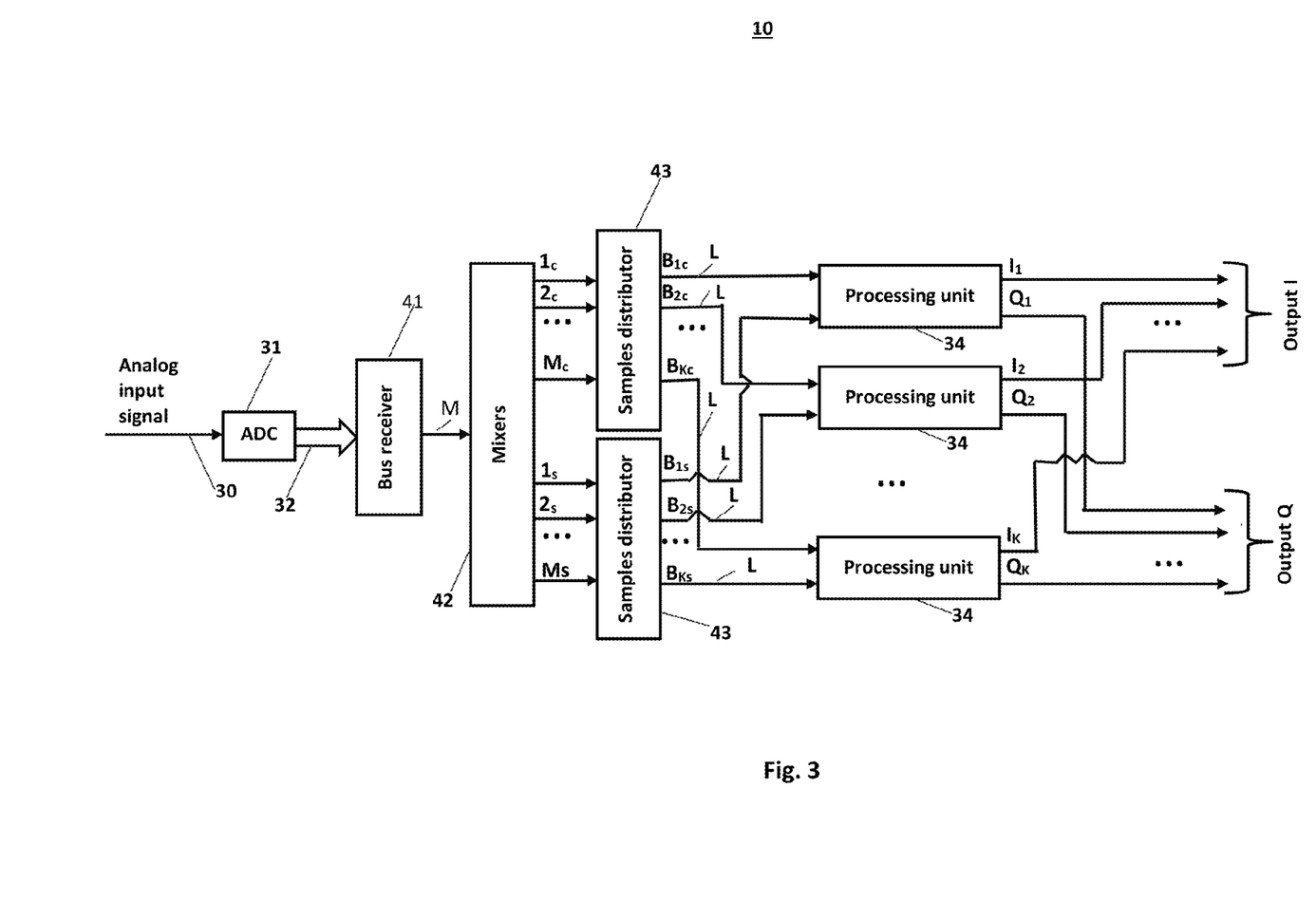
FIG. 3 shows a block diagram of the first embodiment of the present invention.
Figure 3A:
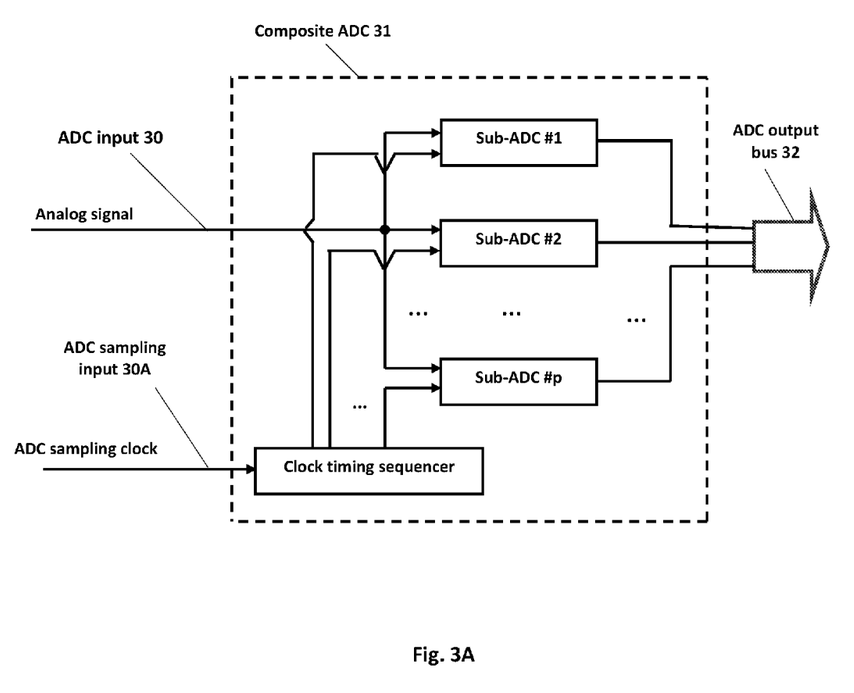
FIG. 3A shows a block diagram of an exemplary composite ADC of that embodiment.

A block diagram of a first embodiment of a digital down converter 10 is shown in FIG. 3. The block diagram of FIG. 3 comprises a high speed composite ADC 31, connected by a bus receiver 41 to a mixers unit 42, two samples distributors 43 and K processing units 34 configured to operate in parallel. As described above, in a form, composite ADCs consist of a number of interleaved sub-ADCs with a common input and sequential timing. In general, the amplitude and phase frequency responses of the different sub-ADCs are not identical, resulting in specific signal distortions, for example, the appearance of spurious frequency components. FIG. 3A shows a block diagram of the exemplary high speed composite ADC 31, including P sub-ADCs: sub-ADC #1, sub-ADC #2, . . . , sub-ADC #p. In FIG. 3A, an ADC input 30 receives an input analog signal, with a carrier frequency $F_c$, which is applied to the inputs of sub-ADC #1, sub-ADC #2, . . . , sub-ADC #p. An ADC sampling clock input of ADC 31 receives an ADC sampling clock signal at sampling frequency $F_s$. The ADC sampling clock signal is split by a clock timing sequencer into separate sequential clock signals, each of which is applied to a respective one of the P sub-ADCs to effect the interleaved operation of the sub-ADCs. The sub-ADCs are responsive to the applied analog signal and the ADC sequential clock signals to provide at an ADC output bus 32, an ADC signal representative of the applied analog signal.

An analog input signal on input line 30 is converted by ADC 31 into a high speed digital signal with a sampling rate $F_s$. The data from the ADC 31 are transmitted to the following units through bus 32, which preferably is a certain type, for example, LVDC or Serializer/Deserializer (SerDes), although other types can be used. The bus receiver 41 divides the input data stream into $M=F_s/F_o$ lines, each line having data frequency $F_o$, equal to the operation frequency of the apparatus.

The lines from bus receiver 41 are applied to the inputs of the mixers unit 42. At mixers unit 42, the sample with a number n, which arrived over one of the lines, is multiplied by $\cos(2\pi \cdot F_c/F_s \cdot n)$ and simultaneously by $\sin(2\pi \cdot F_c/F_s \cdot n)$. The two products are placed at the corresponding outputs $1_c, \ldots, M_c$ and $1_s, \ldots, M_s$, of the mixers unit 42, wherein the number of outputs is $2 \cdot M$.

The outputs of the mixers unit 42 are connected to the inputs of a pair of samples distributors 43 by cosine lines $1_c, \ldots, M_c$ and sine lines $1_s, \ldots, M_s$. During a period of the frequency $F_o$, each of the samples distributors 43 receives M samples. A buffer register, incorporated in the samples distributor 43, delays each input sample by one period of the frequency $F_o$. In that way, a second set of M samples is created. The incoming samples and the delayed samples together form a set of 2M samples, wherein those samples are numbered in accordance with the order of appearance in the input signal.

The number of outputs, K, of each of the samples distributor 43, equals the ratio $B/F_o$, where B is the sampling rate of the baseband signals at the outputs of the down converter. The ratio of the ADC sampling rate Fs to the sampling rate of the baseband signals at the outputs of the down converter B is called the decimation factor DF.

The samples distributor 43 produces at the output with the number i ($0 \leq i < K$) a word $W_i$ according to a rule: $W_i = \{S_{i \cdot DF}, S_{i \cdot DF+1}, \ldots, S_{i \cdot DF+L-1}\}$, where $S_m$ is a sample with the number m from the set of 2M samples. In the samples distributor 43, which is connected to the mixers unit 42 by the cosine lines, the produced word $W_i$ is placed on a bus labeled $B_{ic}$, whereas in the samples distributor 43, which is connected to the mixers unit 42 by the sine lines, the produced word $W_i$ is placed on a bus labeled $B_{is}$. The number of samples in a word $W_i$ equals L, therefore the number of lines in each output bus of the samples distributors 43 equals L also.

The output bus of the samples distributor 43 with a number i, is connected to one of K processing units 34 with the same number. The bus $B_{ic}$ leads to an I input of the processing unit 34 with the number i and the bus $B_{is}$ leads to a Q input of the processing unit 34 with the number i.

The processing unit 34 with the number i processes the two words received from the samples distributors 43 and produces at its two outputs, samples $I_i$ and $Q_i$ of resulting baseband signals. The set of samples $I_i$, $0 \leq i < K$ forms the output I of the down converter, and the set of samples $Q_i$, $0 \leq i < K$ forms the output Q of the down converter.

The samples that come to I and Q inputs of the processing unit 34 may be considered as a real and imaginary parts of a complex sample $Z_n$, where n is the number of the sample in the initial signal produced by ADC 31. The processing unit 34 calculates the outputs samples $I_i$ and $Q_i$ as a convolution of the samples $Z_n$ with prepared-in-advance complex coefficients $C_{p,k}$, which control the operation of the down converter, according to:

$$Ii + j \cdot Qi = \sum_{k=0}^{L-1} C_{p,k} \cdot Z_{i+L/2-k},$$

where p is the number of sub-ADC that produced the middle sample of the word $W_i$, and k is the number of coefficient in the set of L coefficients.

As can be readily appreciated, due to the arrangement of the samples distributor 35 described above, each of the processing units 34 receives at its input a set of L samples, these samples constituting a piece of the digital signal produced by ADC 31. The pieces that come to the inputs of the different K processing units 34 are spaced in the digital signal by an interval equal to the decimation factor DF. For this reason, the samples rate at the outputs of the down converter is $F_o \cdot K = B$, which equals the rate of processed pieces succession in the digital signal.

Figure 4:
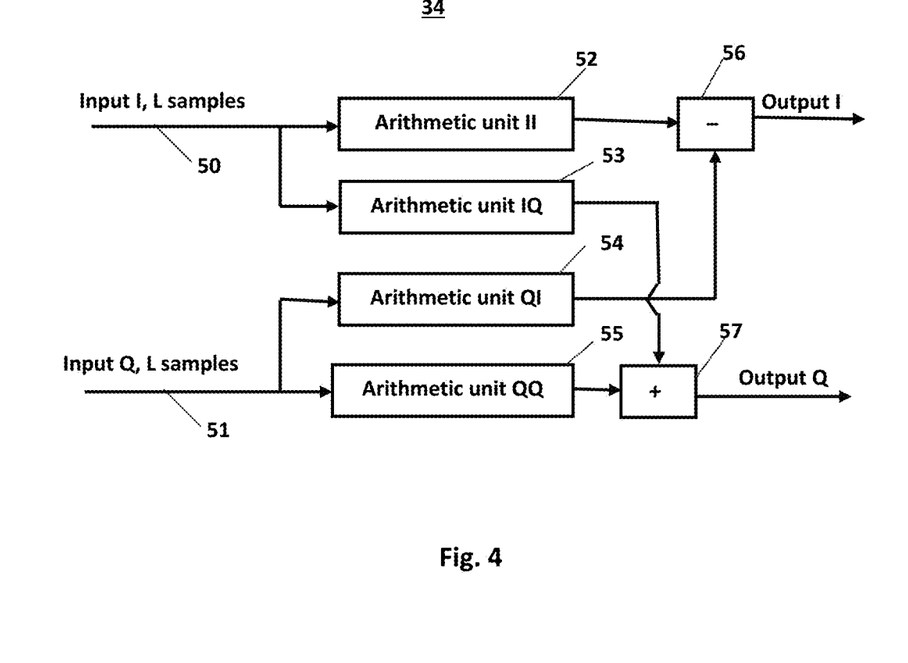
FIG. 4 shows a block diagram of an exemplary processing unit of the first embodiment of the present invention.

All processing units are the same, and the distinction lies in the sets of samples coming to the inputs and in the sets of coefficients loaded in them. A block diagram of a processing unit is shown in FIG. 4. This block diagram contains four arithmetic units II 52, IQ 53, QI 54 and QQ 55. The inputs of the arithmetic units II and IQ are connected together and connected to the input I of the processing unit. The inputs of the arithmetic units QI and QQ are connected together and connected to the input Q of the processing unit. A subtractor 56 forms output I of the processing unit as a difference between the output of the arithmetic units II 52 and the output of the arithmetic units QI 54. An adder 57 forms output Q of the processing unit as a sum of the output of the arithmetic units IQ 53 and the output of the arithmetic units QQ 55.

The equalization of the sub-ADCs misalignment in a composite ADC requires the use of P sets of coefficients $C_{p,k}$, a set containing L coefficients. The number p of a set ($0 \leq p < P$) equals the number of sub-ADC that produced processed sample.

The block diagram of the processing unit is a conventional block diagram of a complex filter. The operation of a processing unit is controlled by an assembly of sets of complex coefficients $\{C_{p,k}\}$ that are loaded into it. The real parts of the of complex coefficients $D_{p,k}=\text{Re}(C_{p,k})$ are loaded into the direct branches of the processing unit—into the arithmetic units 52 and 55. The imaginary parts of the of complex coefficients $E_{p,k}=\text{Im}(C_{p,k})$ are loaded into the cross branches of the processing unit—into the arithmetic units 53 and 54.

Figure 5:
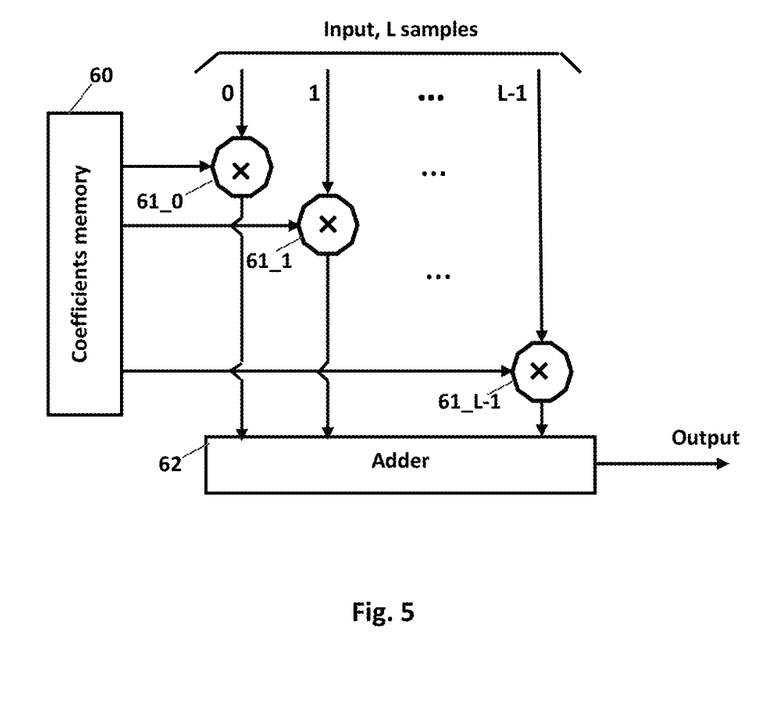
FIG. 5 shows a block diagram of an exemplary arithmetic unit of a processing unit of FIG. 4.

A block diagram of an exemplary arithmetic unit 34 is shown in the FIG. 5. A set of L samples arrives at the inputs $0, 1, \ldots, L-1$ of the arithmetic unit. Each sample passes to an input of a corresponding multiplier 61, the second input of which is connected to the coefficients memory 60. The multiplier produces at its output, a product of the sample and the corresponding coefficient. The outputs of all multipliers are connected to the inputs of an adder 62 that calculates the sum of products that have come from the multipliers. In that way, a convolution of the input set of L samples with the coefficients, coming from the coefficients memory, is formed and placed at the output of the arithmetic unit.

To analyze the operation of the down converter, consider that a complex exponential $s_0(n)=\exp(j\cdot 2\pi\cdot F/F_s\cdot n)$ is applied to the input of the ADC 31 (where n is the number of a current sample). The sample with the number n is processed by an sub-ADC with the number p=n mod(P), where P is the number of sub-ADCs in the composite ADC. If the complex frequency response of the sub-ADC with the number p is $H_p(F)$, then the output of ADC is $s_1(n)=H_p(F)\cdot\exp(j\cdot 2\pi\cdot F/F_s\cdot n)$. The multipliers in the mixers unit 34 produce two products: $s_1(n)\cdot\cos(2\pi\cdot F_c/F_s\cdot n)$ and $s_1(n)\cdot\sin(2\pi\cdot F_c/F_s\cdot n)$. This operation is equivalent to multiplication of the samples $s_1(n)$ by a complex exponential $\exp(-j\cdot 2\pi\cdot Fc/F_s\cdot n)$ and generation of a product $\exp(j\cdot 2\pi\cdot(F-Fc)/F_s\cdot n)$. The samples distributors 43 assemble these products into words with the length L and send them to the processing units 34. The processing units 34 forms a convolution of received words with the coefficients C(p,k), so that the sample Z(n) at the output of the down converter equals $$Z(n) = I + j\cdot Q = \exp(j\cdot 2\pi\cdot F\cdot n)\cdot \sum_{k=0}^{L-1} C(p,k)\cdot H_p(F)\cdot \exp(j\cdot 2\pi\cdot (F-Fc)/F_s\cdot (L/2 - k))$$

and the frequency response FR(F) of the down converter equals $$FR(F) = \sum_{k=0}^{L-1} C(p,k)\cdot H_p(F)\cdot \exp(j\cdot 2\pi\cdot (F-Fc)/F_s\cdot (L/2 - k)).$$

The calculations of the coefficients C(p, k) are based on the requirement that the frequency response FR(F) of the down converter equals a target response T[F], this requirement leading to a following equation for determination of the control coefficients.

$$\sum_{k=0}^{L-1} C(p,k)\cdot H_p(F)\cdot \exp(j\cdot 2\pi\cdot (F-Fc)/F_s\cdot (L/2 - k)) = T(F).$$

Since the number of the control coefficients equals L, it is possible to ensure that the previous equation is true at L frequencies $F_m$, $0\le m<L$. It brings us to P systems of L linear equations each with the control coefficients as unknowns:

$$\sum_{k=0}^{L-1} C(p,k)\cdot H_p(F_m)\cdot \exp(j\cdot 2\pi\cdot (F_m-Fc)/F_s\cdot (L/2 - k)) = T(F_m).$$

The solution of the received set of P system of linear equations determines the P sets, containing each of the L control coefficients. The L control coefficients are loaded into the coefficients memory of the processing units 34 and ensure that the joint operation of ADC 31, mixers unit 42, samples distributors 43 and K processing units 34 perform a transformation of the input analog signal into I/Q baseband signals, which is completely equivalent to the transformation performed by a conventional down converter of the FIG. 1. The coefficients that are loaded into the coefficients memory of the arithmetic units II 52 and QQ 55 equal $D_{pk}$=Re(C(p,k)), and the coefficients that are loaded into the coefficients memory of the arithmetic units IQ53 and QI 54 equal $E_{pk}$=Im(C(p,k)).

Figure 6:
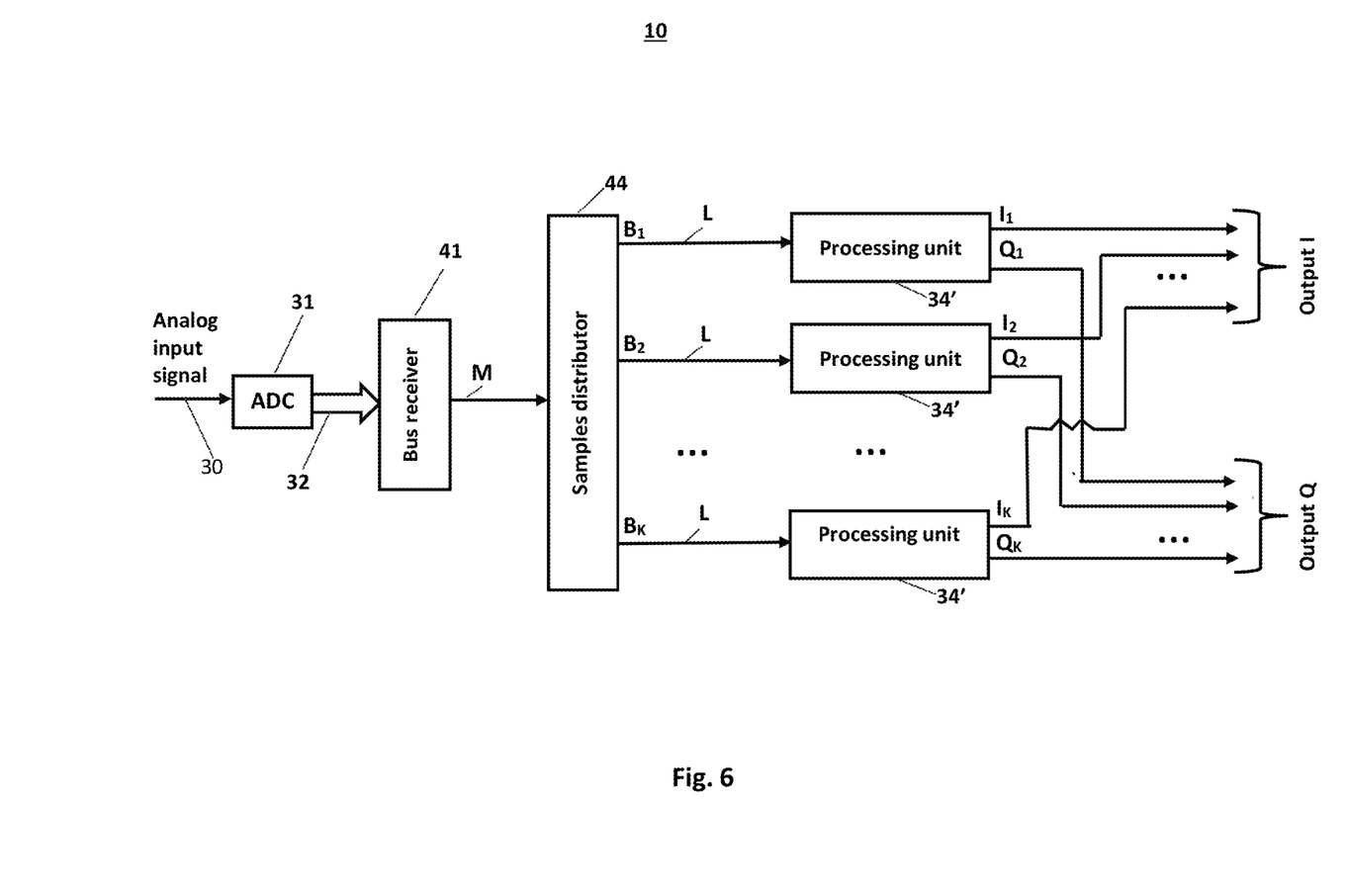
FIG. 6 shows a block diagram of a digital down converter with equalization according another exemplary embodiment of the present invention.

In some cases, a different design of a down converter is preferable, which may lead to further reduction of required number of multipliers. A block diagram of a corresponding exemplary embodiment of the present invention is shown in FIG. 6. This block diagram is similar to the block diagram of FIG. 3 except that the mixers unit and one of samples distributors are omitted. The frequency translation which has been performed by the mixers, is carried out now by the processing units 34' with modified control coefficients.

Figure 7:
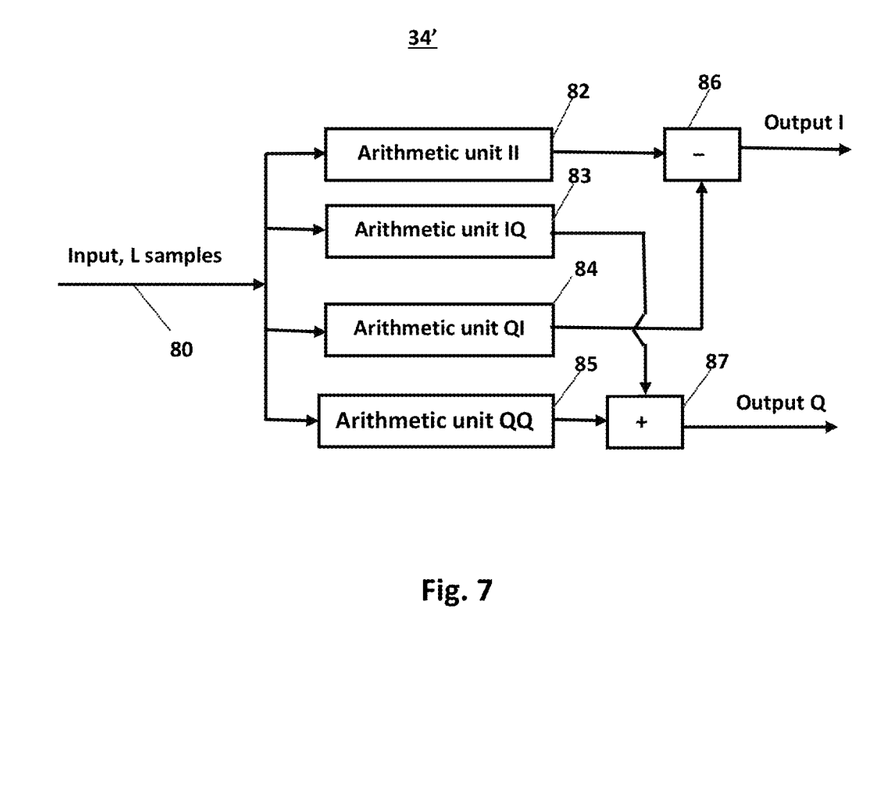
FIG. 7 shows a block diagram of an exemplary processing unit of the embodiment of FIG. 7.

In this exemplary embodiment of the present invention, the processing unit 34' is described by the block diagram of FIG. 7. The general view of the block diagram is the same as in FIG. 4, but the inputs of all arithmetic units 82-85 are united and used as a single input of the respective arithmetic units. The modification of the control coefficients consists of multiplication $C_{pk}$ by $\exp(2\pi\cdot F_o/F_s\cdot n)$. It means that in the arithmetic unit II 82, coefficients are loaded which equal the $D_{pk}$ multiplied by cos $(2\pi\cdot F_o/F_s\cdot n)$. In the arithmetic unit IQ 83 coefficients are loaded, which equal $E_{pk}$ multiplied by cos $(2\pi\cdot F_o/F_s\cdot n)$. In the arithmetic unit QI 84 coefficients are loaded, which equal the $E_{pk}$ multiplied by sin $(2\pi\cdot F_o/F_s\cdot n)$. In the arithmetic unit QQ 85 coefficients are loaded, which equal $D_{pk}$ multiplied by $\sin(2\pi\cdot F_o/F_s\cdot n)$.

Figure 8A:
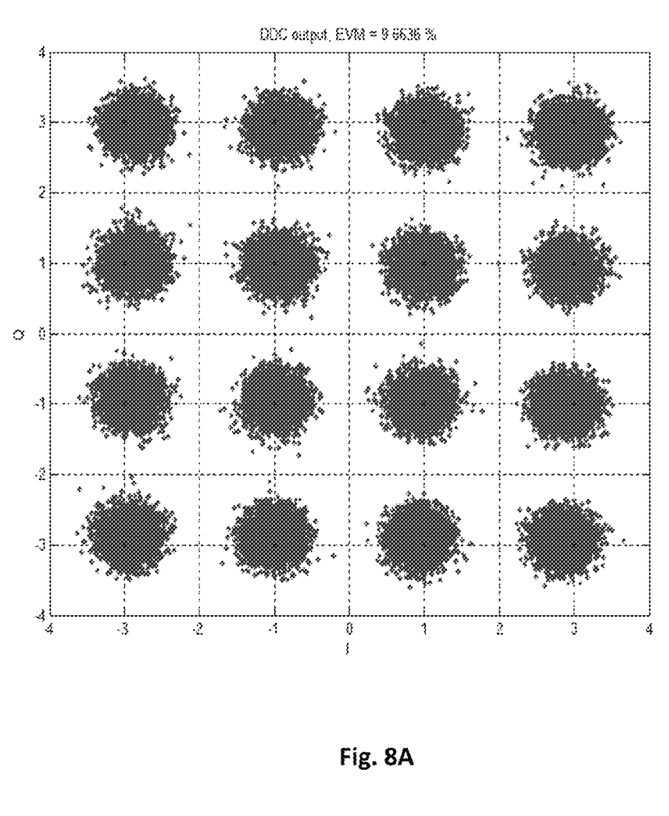
FIGS. 8A and 8B show constellation diagrams for a signal at the output of a down converter without equalization and with equalization of the invention.
Figure 8B:
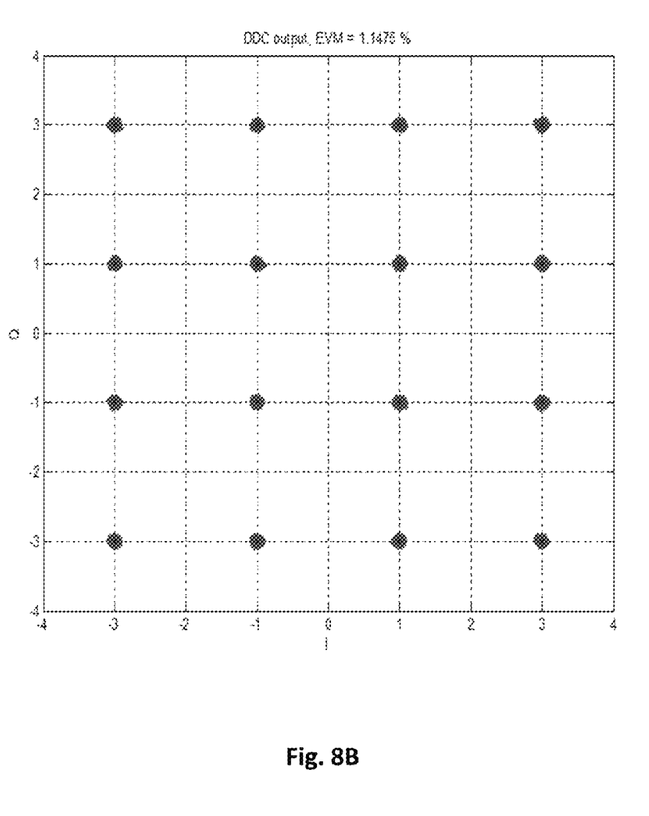

The above described method of digital down conversion with equalization, was verified using a computer simulation. In that simulation, a 16-level quadrature modulated signal was generated with sample rate 2 Gs/s. That, signal was transmitted through a square-root raised cosine filter, up-converted with a 10 GHz carrier frequency and applied to a composite ADC having 40 sub-ADCs. The 40 sub-ADC model was used to simulate ADC distortions at high frequency. The signal produced by the ADC, was down-converted using equalizer coefficients calculated with a square-root raised cosine target filter according to the present invention. The quality of the demodulated down-converted signal was estimated using an error vector magnitude (EVM) method. FIG. 8A shows a constellation diagram with the equalization turned off. In this case, error vector magnitude (EVM) exceeds 9.5%. That high EVM value is caused by spurious components which appeared because of the misalignment of the sub-ADCs, together with the distortions of the amplitude and group delay frequency responses. When the equalizer of this invention was enabled, EVM value improved to about 1.15%. (FIG. 8B).

In summary, the forms of the invention illustrated in both FIG. 3 and FIG. 6, as well as other form of the invention, enable significant improvements in terms of reduction of computational burden for digital down conversion with equalization, compared to the down conversion systems of the prior art.

In the form of the invention illustrated in FIG. 3, (i) the mixers unit 42 includes 2M multipliers used in the down conversion effected by mixers unit 42, and (ii) the arithmetic units 51, 52, 53 and 54 of each of the processing units 34 also include L multipliers used with the "convolution" control coefficients stored in the coefficient memory 60 of each of the arithmetic units. The down conversion effected by the mixers unit 42, together with the multiplication of the down converted samples with the stored "convolution" control coefficients, provides a transformation of an input analog signal into I/Q baseband signals which is mathematically equivalent to conventional down conversion with equalization, but the computational burden posed by the multipliers in the form of FIG. 3 is significantly less than that of systems of the prior art.

In the form of the invention illustrated in FIG. 6, the configuration enables a significant improvement in computational burden compared with the form illustrated in FIG. 3. In particular, there is no element in the form of FIG. 6 corresponding directly to the mixers unit 42 of the form of FIG. 3, and thus there is an immediate reduction in the number of multipliers.

In the form of FIG. 6, the arithmetic units 82-85 of each of the processing units 34', are similar to those in the form of FIG. 3, in that they include L multipliers used with the control coefficients stored in the coefficient memory 60 of each of the arithmetic units. However, in contrast to the "convolution" control coefficients stored in memory 60 of the form of FIG. 3, the coefficient memory 60 of the arithmetic units 82-85 of each of the processing units 34' stores a set of "mixer/convolution" control coefficients, which when multiplied with applied L sample values, effect both the down conversion and convolution of the sample signals. Those multiplications thereby provide a transformation of an input analog signal into I/Q baseband signals which is also mathematically equivalent to conventional down conversion with equalization, but the computational burden posed by the multipliers in the form of FIG. 6 is significantly less than that of systems of the form of FIG. 3, which in turn is significantly less than that of systems of the prior art.

Although the foregoing description of the embodiment of the present invention contains some details for purposes of clarity of understanding, the invention is not limited to the detail provided. There are many alternative ways of implementing the invention. The disclosed embodiments are illustrative and not restrictive.

What is claimed is:

1. A digital down converter comprising:
   A. an analog to digital converter (ADC) having:
      an ADC signal input for receiving an applied analog signal characterized by a carrier frequency $F_c$,
      an ADC sampling clock input for receiving an applied ADC sampling clock signal characterized by a sampling rate $F_s$, and
      an ADC output, wherein the ADC is responsive to the applied analog signal and the ADC sampling clock signal to provide at the ADC output, an ADC digital signal representative of the applied analog signal,
      wherein the ADC is a composite ADC including a plurality P of interleaved sub-ADCs, and wherein each sub-ADC is characterized by an associated amplitude response and an associated phase response,
   B. a bus receiver having an input configured to receive the ADC digital signal at the sampling rate $F_s$, and including an M-line bus output characterized by an operating clock frequency $F_o$, where $M=F_s/F_o$,
   C. a mixers unit having an input connected to the respective M lines of the bus output, and configured to receive M cosine signals at frequency $F_c$, and M sine signals at frequency $F_c$,
      wherein the mixers unit is configured to multiply
      (i) the signals on the respective M lines of the bus output by the M cosine signals, and apply resultant cosine output signals $1_c, \ldots, M_c$ to a first M of the 2M outputs, and
      (ii) the signals on the respective M lines of the bus output by the M sine signals, and apply resultant sine output signals $1_s, \ldots, M_s$ to a second M of the 2M outputs,
   D. a first samples distributor and a second samples distributor, each of the samples distributors having M inputs and K outputs, wherein:
      (i) the number K of distributor outputs equals the ratio of the sample rate of baseband signals B to the operating clock frequency $F_o$,
      (ii) each of the K outputs is an L-lines bus clocked at frequency $F_o$,
      (iii) the M inputs of the first samples distributor are configured to receive from the mixer unit the respective cosine output sample signals $1_c, \ldots, M_c$, to transform those samples signals into words $B_{1c}, \ldots, B_{Kc}$ with the length of L samples each, and to apply said words $B_{1c}, \ldots, B_{Kc}$ at the respective K first samples distributor outputs,
      (iv) the M inputs of the second samples distributor are configured to receive from the mixer unit the respective sine output samples signals $1_s, \ldots, M_s$, to transform those sample signal into words $B_{1s}, \ldots, B_{Ks}$ with the length of L samples each, and to apply said words $B_{1s}, \ldots, B_{Ks}$ at the respective K second samples distributor outputs,
   E. K processing units operating in parallel,
      (i) wherein each of the processing units has an input I and an input Q,
      (ii) wherein for each processing unit,
         input I is connected to a corresponding output of the first samples distributor, and
         input Q is connected to a corresponding output of the second samples distributor,
      (iii) whereby pairs of samples applied to the input I and to the input Q form a complex valued sample for calculation of a convolution with the coefficients stored in the coefficients memory of the processing unit.

2. A digital down converter in accordance with the claim 1, wherein
   each of the processing units comprises:
   an arithmetic unit II having an input and an output,
   an arithmetic unit IQ having an input and an output,
   an arithmetic unit QI having an input and an output,
   an arithmetic unit QQ having an input and an output,
   a subtractor having a first input, a second input and an output, and
   an adder having a first input, a second input and an output,
   wherein:
   a. the inputs of arithmetic unit II and arithmetic unit IQ are joined together and configured to receive an input I from the processing unit;
   b. the inputs of arithmetic unit QI and arithmetic unit QQ are joined together and configured to receive an input Q from the processing unit;
   c. the subtractor is responsive to a value representative of a sample applied to its first input and a value representative of a sample applied to its second input, and to apply a resulting difference signal at its output;
   d. the output of the arithmetic unit II is connected to the first input of the subtractor, and the output of the arithmetic unit QI is connected to the second input of the subtractor;
   e. the output of the arithmetic unit IQ is connected to the first input of the adder, and the output of the arithmetic unit QI is connected to second input of the adder, whereby the adder produces at its output, a sum of the samples coming to its inputs;

f. the output of the subtractor provides an output I of the processing unit and the output of the adder provides an output Q of the processing unit.

3. A digital down converter in accordance with claim 2, wherein each arithmetic unit comprises:
   i. L multipliers, wherein each multiplier has two inputs and an output and generates at its output, a product of signals at the two inputs,
   ii. an adder having L inputs and one output, wherein the adder generates at its output, a signal representative of sum of signals at the L inputs,
   iii. a convolution coefficients memory having L outputs, and adapted for storing plurality of L-convolution coefficient values and selectively applying the L convolution coefficient values to the L outputs,
      wherein one input of each multiplier is configured to receive a corresponding input of the arithmetic unit, the other input of each multiplier is configured to receive an associated one of the convolution coefficient values from the convolution coefficient memory, and the outputs of the L multipliers are applied to the respective inputs of the adder.

4. A digital down converter in accordance with claim 3, wherein the convolution coefficients stored in the coefficients memory include P sets, each set comprising L convolution coefficients, and wherein the number P is equal to the number of the sub-ADCs in the composite ADC.

5. A digital down converter with equalization of claim 4, wherein the convolution coefficients comprise a family of solutions of a set of linear equations systems $$\sum_{k=0}^{L-1} C(p,k) \cdot H_p(F) \cdot \exp(j \cdot 2\pi \cdot (F_m - F_c)/F_s \cdot (L/2 - k)) = T(F_m),$$

where C(p,k) is a set of convolution coefficients, p is the number of a convolution coefficient set, and k is the number of a convolution coefficient in the set, $H_p(F)$ is a complex frequency response of a sub-ADC with the number p in the composite ADC, and $F_m$ is one of L frequencies where a frequency response of the down converter coincides with a target frequency response T(F).

6. A digital down converter in accordance with claim 5, wherein a target frequency response T(F) includes a frequency response of a low pass filter suppressing out of band components.

7. A digital down converter in accordance with claim 6, wherein a target frequency response T(F) includes a frequency response of a low pass filter that meets Nyquist ISI criterion.

8. A digital down converter comprising:
A. an analog to digital converter (ADC) having:
   an ADC signal input for receiving an applied analog signal characterized by a carrier frequency $F_c$,
   an ADC sampling clock input for receiving an applied ADC sampling clock signal characterized by a sampling rate $F_s$, and
   an ADC output, wherein the ADC is responsive to the applied analog signal and the ADC sampling clock signal to provide at the ADC output, an ADC digital signal representative of the applied analog signal,
   wherein the ADC is a composite ADC including a plurality P of interleaved sub-ADCs, and wherein each sub-ADC is characterized by an associated amplitude response and an associated phase response,
B. a bus receiver having an input configured to receive the ADC digital signal at the sampling rate $F_s$, and including an M-lines bus output characterized by an operating clock frequency $F_o$, where $M=F_s/F_o$,
C. a samples distributor having M inputs and K outputs, wherein:
   (i) the number K of distributor outputs equals the ratio of the sample rate of baseband signals B to the operating clock frequency $F_o$,
   (ii) each of the K outputs is an L-lines bus clocked at frequency $F_o$,
   (iii) the M inputs of the samples distributor are configured to receive the output signals from the M-lines bus of the bus receiver, to transform those samples signals into words $B_1, \ldots, B_K$ with the length of L samples each, and to apply said words $B_1, \ldots, B_K$ at the respective K samples distributor outputs,
D. K processing units operating in parallel, wherein each processing unit includes an input and an output,
   wherein the inputs of the K processing units are connected to respective outputs of the samples distributor,
   wherein each processing unit configured to calculate a convolution of L input samples with L coefficients stored in the coefficients memory.

9. A digital down converter in accordance with claim 8, wherein
each of the processing units comprises:
   an arithmetic unit II having an input and an output,
   an arithmetic unit IQ having an input and an output,
   an arithmetic unit QI having an input and an output,
   an arithmetic unit QQ having an input and an output,
   a subtractor having a first input, a second input and an output, and
   an adder having a first input, a second input and an output, and
wherein:
   a. the inputs of arithmetic unit II, arithmetic unit IQ, arithmetic unit QI and arithmetic unit QQ are joined together and configured to receive an input from the processing unit;
   b. the subtractor is responsive to a value representative of a sample applied to its first input and a value representative of a sample applied to its second input, and to apply a resulting difference signal at its output;
   c. the output of the arithmetic unit II is connected to the first input of the subtractor, and the output of the arithmetic unit QI is connected to the second input of the subtractor;
   d. the output of the arithmetic unit IQ is connected to the first input of the adder, and the output of the arithmetic unit QI is connected to second input of the adder, whereby the adder produces at its output, a sum of the samples coming to its input, and
   e. the output of the subtractor provides an output I of the processing unit and the output of the adder provides an output Q of the processing unit.

10. A digital down converter in accordance with claim 9, wherein the convolution coefficients are products of C(p,k) and $\exp(j \cdot 2\pi \cdot F_c/F_s \cdot n)$, where n is a number of a sample, quantities C(p,k) comprise a family of solutions of the foregoing set of linear equations, p is the number of a convolution coefficient set, and k is the number of a convolution coefficient in the set.

* * * * *